(12) United States Patent
Tripathi et al.

(10) Patent No.: US 6,671,849 B2
(45) Date of Patent: Dec. 30, 2003

(54) RELIABILITY-BASED TYPE-II HYBRID ARQ SCHEME

(75) Inventors: Vinayak Tripathi, Schaumburg, IL (US); Roger Peterson, Inverness, IL (US); Eugene Visotsky, Skokie, IL (US); Michael Honig, Evanston, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/146,587

(22) Filed: May 14, 2002

(65) Prior Publication Data

US 2003/0217319 A1 Nov. 20, 2003

(51) Int. Cl.$^7$ ............................ G06F 11/00; H04L 1/18; G08C 25/02
(52) U.S. Cl. ..................... 714/746; 714/748; 714/749; 375/377
(58) Field of Search .................. 714/749, 746, 714/751, 748, 752, 755, 757, 758, 774, 782, 784, 786, 792, 797; 375/262, 264, 265

(56) References Cited

U.S. PATENT DOCUMENTS

| | | | | |
|---|---|---|---|---|
| 4,803,685 A | * | 2/1989 | Oget ........................... | 714/749 |
| 5,600,663 A | * | 2/1997 | Ayanoglu et al. ............ | 714/774 |
| 5,878,098 A | * | 3/1999 | Wang et al. ................. | 375/377 |
| 6,009,553 A | * | 12/1999 | Martinez et al. ............ | 714/784 |
| 2001/0056560 A1 | | 12/2001 | Khan et al. .................. | 714/746 |

\* cited by examiner

*Primary Examiner*—Emmanuel L. Moise
(74) *Attorney, Agent, or Firm*—Kenneth A. Haas (57) ABSTRACT

A communication system employs a HARQ-type retransmission scheme. Bits (701) received on a first transmission are stored and combined with the bits received on later transmissions thereby increasing the likelihood of a correct decoding on later transmissions. Similarly the bits received on the second or later transmissions are stored for combining with subsequent received bits. Specific information needed at the receiver is identified and requested from the transmitter. More particularly, information that is retransmitted in a second or later transmission in the HARQ scheme is determined from a reliability of individual constituent bits in the mother codeword or from an overall reliability of the received codeword. Based on these reliability metrics, the most unreliable set of the constituent bits are requested or, in the alternative, a specific number of constituent bits is requested.

13 Claims, 4 Drawing Sheets

RELIABILITY-BASED TYPE-II HYBRID ARQ SCHEME

FIELD OF THE INVENTION

The present invention relates generally to systems that employ hybrid ARQ schemes and in particular, to a reliability-based type-II hybrid ARQ scheme.

BACKGROUND OF THE INVENTION

Digital data transmissions over wired and wireless links sometimes may be corrupted, for instance, by noise in the link or channel, by interference from other transmissions, or by other environmental factors. Even with clear communication channels, which lend themselves to high data rates, it may not be possible to appropriately decode the data stream with the requisite error rates. In order to solve this problem, many current communication systems employ an automatic repeat request (ARQ) scheme for retransmission. In such systems an opportunity exists for requesting that data be retransmitted upon detection of an error. In more complex systems a type-II hybrid ARQ scheme is employed. In systems employing a type-II hybrid ARQ (HARQ) scheme a receiver combines previously received erroneous transmissions of a packet of information with a newly received transmission in an effort to successfully ascertain the true contents of the packet. In other words, coded bits received on a first erroneous transmission are stored and combined with the coded bits received on later transmissions thereby increasing the likelihood of a correct decoding on later transmissions. Similarly the coded bits received on the second or later transmissions are stored for combining with subsequent received bits.

While the above-described HARQ scheme does eliminate many errors that occur during transmission, no attempt is made by the system to identify the size or content of the information needed at the receiver to execute a successful decoding, and to request that information from the transmitter. Because of this, it is very likely that retransmissions include information that is unnecessary, decreasing overall system capacity. Therefore, a need exists for a method and apparatus for a HARQ scheme that minimizes the transmission of unnecessary information.

DETAILED DESCRIPTION OF THE DRAWINGS

To address the above-mentioned need a method and apparatus for performing HARQ transmission is described herein. Bits received on a first transmission are stored and combined with the bits received on later transmissions thereby increasing the likelihood of a correct decoding on later transmissions. Similarly the bits received on the second or later transmissions are stored for combining with subsequent received bits. Specific information needed at the receiver is identified and requested from the transmitter. More particularly, information that is retransmitted in a second or later transmission in the type-II HARQ scheme is determined from the reliability of individual constituent bits in the mother codeword or from an overall reliability of the received codeword. Based on these reliability metrics, the most unreliable set of the constituent bits is requested or, in the alternative, a specific number of constituent bits is requested. In general, it is assumed that retransmissions of a packet can include bits from the mother codeword that have not been transmitted as yet as well as bits that have been included in previous transmissions.

The present invention encompasses a method for performing HARQ transmission within a communication system. The method comprises the steps of receiving and decoding a first plurality of bits, determining a current quality metric based on the first plurality of bits, and determining a target quality metric. A number of additional bits needed to achieve the target quality metric is then determined and the number of additional bits needed to achieve the target quality metric is requested.

The present invention additionally encompasses a method comprising the steps of receiving a plurality of bits in error after the ith transmission, decoding the plurality of bits, and determining a quality metric ($\mu_i$) based on the plurality of bits. A target quality ($\mu^*_{i+1}$) is determined, and a number ($N_{i+1}$) of additional bits needed to achieve the target quality metric is also determined. The number of additional bits needed to achieve the target quality metric is then requested as part of an ACK/NAK.

The present invention additionally encompasses a method for performing HARQ transmission within a communication system. The method comprises the steps of receiving and decoding a first plurality of bits from a mother codeword, determining a quality metric for each bit within the mother codeword, and determining individual bits that should be retransmitted. The individual bits are then requested as part of an ACK/NAK procedure.

The present invention additionally encompasses an apparatus comprising a decoder outputting reliabilities, a quality metric generator outputting a quality metric, and a number generator, receiving the current quality metric, a target quality metric, and a channel condition and determining a number of additional bits needed to achieve the target quality metric.

Figure 4:
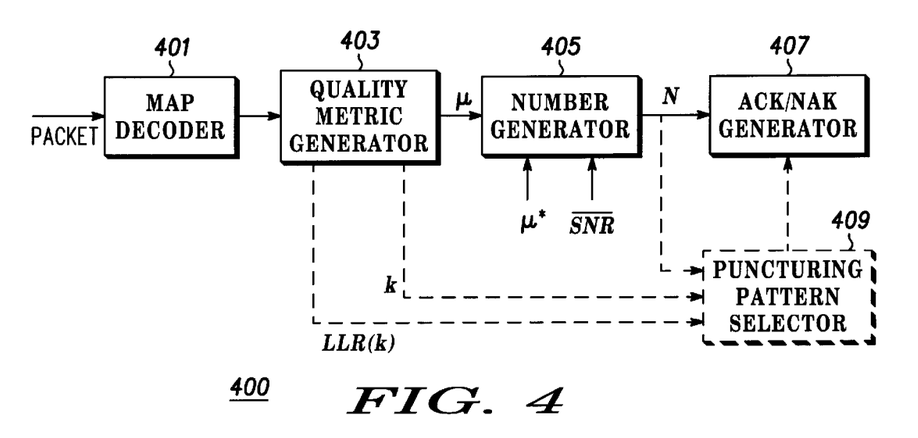
FIG. 4 is a block diagram of a receiver in accordance with the preferred embodiment of the present invention.

The present invention additionally encompasses an apparatus comprising means (401) for decoding a received plurality of bits after the ith transmission, means (403) for determining a quality metric ($\mu_i$), means (403) for determining a target quality ($\mu^*_{i+1}$), means (405) for determining a number ($N_{i+1}$) of additional bits needed to achieve the target quality metric, and means (407) for requesting the number of additional bits needed to achieve the target quality metric.

Finally, the present invention encompasses an apparatus comprising means (401) for decoding a received plurality of bits from a data packet, means (403) for determining a quality metric for each bit within a mother codeword, means (409) for determining individual bits from the mother codeword that should be retransmitted, and means (407) for requesting the individual bits that should be retransmitted.

Figure 1:
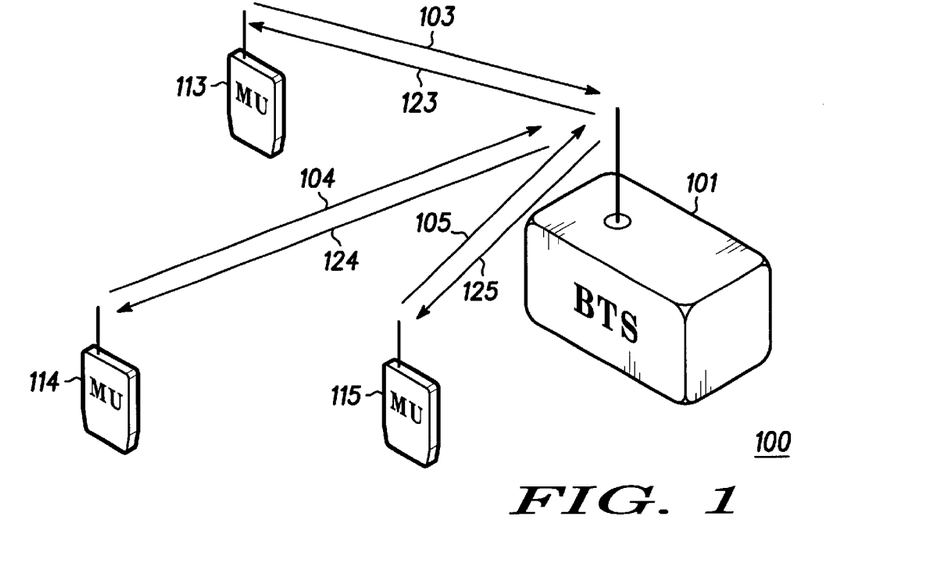
FIG. 1 is a block diagram of a communication system in accordance with the preferred embodiment of the present invention.

Turning now to the drawings, wherein like numerals designate like components, FIG. 1 is a block diagram of communication system 100 in accordance with the preferred embodiment of the present invention. In the preferred embodiment of the present invention, communication system 100 utilizes the next generation Global System for Mobile Communications (GSM) protocol, but in alternate embodiments communication system 100 may utilize other communication system protocols such as, but not limited to, the Wireless LAN standards such as 802.11b, a next generation CDMA architecture as described in the cdma2000 International Telecommunication Union-Radio communication (ITU-R) Radio Transmission Technology (RTT) Candidate Submission document, or the CDMA system protocol as described in "Personal Station-Base Station Compatibility Requirements for 1.8 to 2.0 GHz Code Division Multiple Access (CDMA) Personal Communication Systems" (American National Standards Institute (ANSI) J-STD-008).

Communication system 100 includes at least one Base Transceiver Station (BTS) 101, and multiple mobile units (MUs) 113–115. Although not shown, communication system 100 additionally includes well known network elements such as Mobile Switching Centers (MSCs), Centralized Base Station Controllers (CBSCs) in a circuit switch network, or such as Radio Network Controller (RNCs), Gatekeepers (GKs) and GateWays (GWs) in a packet switch network. It is contemplated that network elements within communication system 100 are configured in well known manners with processors, memories, instruction sets, and the like, which function in any suitable manner to perform the function set forth herein.

As shown, remote, or mobile units 113–115 are communicating with BTS 101 via uplink communication signals 103–105, respectively, while BTS 101 is communicating with remote units 113–115 via downlink communication signals 123–125, respectively. As discussed above, digital data transmissions over wired and wireless links sometimes may be corrupted, for instance, by noise in the link or channel, by interference from other transmissions, or by other environmental factors. In order to help correct corrupted transmissions, communication system 100 employs a type-II HARQ retransmission scheme. In other words, bits received on a first transmission are stored and combined with the bits received on later transmissions thereby increasing the likelihood of a correct decoding on later transmissions. Similarly the bits received on the second or later transmissions are stored for combining with subsequent received bits.

In the preferred embodiment of the present invention, an attempt is made by the system to identify the specific information needed at the receiver (whether remote units 113–115 or base station 101) to execute a successful decoding, and to request that information from the transmitter. More particularly, information that is retransmitted in a second or later transmission in the HARQ scheme is determined from a reliability of individual constituent bits in the mother codeword or from an overall reliability of the received codeword. Based on these reliability metrics, the most unreliable set of the constituent bits are retransmitted or, in the alternative, a specific number of constituent bits are retransmitted.

In the preferred embodiment of the present invention the reliability of the received codeword is computed as the average magnitude of the log-likelihood ratios of the information bits transmitted in the current packet. (Alternatively, the log-likelihood ratios of all constituent bits in the mother codeword can be used to compute reliability). A MAP decoder, implemented within all receivers, utilizes a Bahl, Coch, Jelinek & Raviv (BCJR) algorithm, to compute the required log-likelihood ratios as described in Bahl, et al., "Optimal Decoding of Linear Codes for Minimizing Symbol Error Rate", *IEEE Transactions on Information Theory*, March 1974. However, it should be noted that any decoding scheme that can generate soft outputs, such as a soft output Viterbi decoder, can be used to generate the required reliabilities.

The reliability information is accumulated at the receiver from preceding transmissions and used to determine the optimum size and/or content of subsequent transmissions, which are then requested from the transmitter. Designing HARQ schemes based on the reliability information provides several advantages. Namely:

The reliability metrics are computed at the output of the decoder and hence are inherently more accurate in providing information about the state of the received codeword than channel quality based reliability measures, such as signal-to-noise ratio (SNR).

The reliability of the individual bits in the mother codeword can be used for determining which bits are to be retransmitted, providing information about the content as well as the size of the retransmissions.

Prior to describing a HARQ scheme in accordance with the preferred embodiment of the present invention the following text and equations are provided to set the necessary background for utilization of the preferred embodiment of the present invention. Additionally, the description that follows is given with respect to a transmitting base station and a receiving remote unit, however, one of ordinary skill in the art will recognize that a similar technique may be utilized by the base station to receive transmissions from remote units.

System Model

Within communication system 100, each packet transmitted over communication signals 104–105 and 123–125 are, assumed to contain I information bits. The initial code rate, $R_1$, is chosen as known in the art by a link adaptation scheme based on, among other factors, an estimate of the quality of the channel. The information bits are encoded using a rate $R_{MC}$ mother code and then punctured up to the rate $R_1$ using an appropriate puncturing pattern. Good puncturing patterns can be found for specific convolutional codes using techniques such as those described in J. Hagenauer, "Rate-Compatible Punctured Convolutional Codes (RCPC Codes) and their Applications," *IEEE Transactions on Communications*, vol. 36, pp. 389–400, April 1988.

The number of coded bits generated by a convolutional encoder is given by $N_{MC}=I/R_{MC}$ and the number of bits after puncturing is given by $N_1=I/R_1$. The $N_1$ coded bits are modulated and transmitted over the appropriate channels. In the preferred embodiment of the present invention BPSK modulation is used, however in alternate embodiments higher order modulations are utilized.

Remote units 113–115 decode their respective downlink signals using a MAP decoder (not shown). An error detection scheme such as a Cyclic Redundancy Check (CRC) is utilized. The remote unit determines whether the packet has been successfully decoded and then transmits an acknowledgment (ACK) or a negative acknowledgment (NAK) back to base station 101. In the preferred embodiment of the present invention the feedback contains information regarding the size and content of the future retransmissions.

If a NAK is received, base station 101 uses the feedback information included in the NAK to construct the retransmission. As mentioned earlier, previously received transmissions are stored and jointly decoded with future transmissions to improve the likelihood of successful decoding. A maximum of M transmissions can be jointly decoded. (A collection of transmissions decoded jointly will hereafter be referred to as an attempt). If the packet is not successfully decoded after M transmissions, the remote unit discards all the information corresponding to the packet and base station 101 reschedules another attempt to transmit the packet at a later time.

The throughput of the HARQ scheme is given by $$\eta = \frac{I(1-p_M)}{\left(N_1 + \sum_{i=2}^{M} N_i p_{i-1}\right) T_b} \text{ bps} \quad (1)$$

where the size of the $i^{th}$ transmission is denoted by $N_i$, $T_b$ is the time required to transmit one BPSK symbol over the channel, and $p_i$ is the probability that the decoding fails after each transmission $j$ for $j=1, \ldots, i$. That is, $$p_i = P\left[\bigcap_{j=1}^{i} \text{Decoding fails after } j^{th} \text{ transmission}\right].$$

The corresponding delay for the HARQ scheme is given by $$T_D = T_{Trans} + T_{Wait} \quad (2)$$
$$= \left(\frac{N_1 + \sum_{i=2}^{M} N_i p_{i-1}}{1 - p_M}\right) T_b + \left(\frac{1 + \sum_{i=2}^{M} p_{i-1}}{1 - p_M}\right) \delta$$

where $T_{Trans}$ is the average cumulative time duration of transmissions of a packet until successful decoding, $T_{Wait}$ is the average cumulative time between transmissions of a packet until successful decoding, and $\delta$ is the average time interval between retransmissions. For simplicity, the expression for $T_{Wait}$ is derived assuming that the interval between attempts is equal to the interval between retransmissions, $\delta$.

Behavior of Error Correcting Codes

In the preferred embodiment of the present invention the behavior of the error correcting codes as a function of codeword reliability is used to design efficient HARQ schemes. The behavior is presented below in the framework of the convolutional codes and puncturing patterns defined in the Enhanced Data-rates for GSM Evolution (EDGE) standard.

The reliability of the codeword, $\mu$, is defined as $$\mu = \frac{1}{I} \sum_{k=1}^{I} |LLR(k)| \quad (3)$$

where LLR(k) is the log likelihood ratio for the $k^{th}$ information bit. That is, $$LLR(k) = \text{Ln} \frac{p(b_k = 1 \mid y)}{p(b_k = 0 \mid y)} \quad (4)$$

where y is the received packet and $b_k$, k=1, . . . , I, is the information sequence. Alternatively, the log-likelihood ratios of all constituent bits in the mother codeword can be used to compute the reliability of the codeword.

The dependence of the probability of decoding failure on the reliability metric, $\mu$, and the dependence of the reliability metric on the number of bits transmitted can be determined empirically via simulation as follows:

Packets of I information bits are encoded, punctured to an initial rate $R_1 = I/N_1$ and transmitted over a channel. The received packet is decoded and its reliability metric $\mu$ is computed and recorded. Then, n additional bits are transmitted over the channel and jointly decoded with the original transmission. The resulting reliability $\mu$ is recorded after every retransmission. Initially, the additional bits are chosen uniformly from the subset of coded bits that have not been transmitted thus far. Once this subset is exhausted, the bits are chosen uniformly across the mother codeword. For each packet, the reliability $\mu$ at which the packet decodes correctly is also recorded.

From the recorded data, the probability density function $f_\mu(x)$ of the reliability at successful decoding can be obtained. In the preferred embodiment of the present invention the probability of decoding failure for a given average reliability a is computed as $$F(a) = \int_a^\infty f_\mu(x) dx$$

Figure 2:
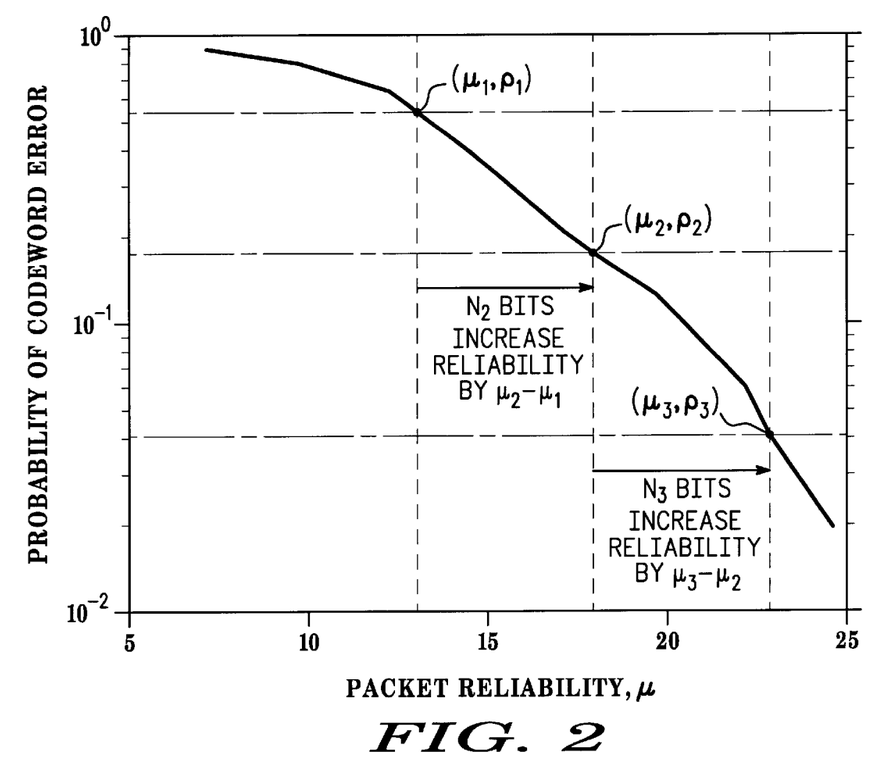
FIG. 2 illustrates a probability of decoding a codeword based on a codeword reliability measure.
Figure 3:
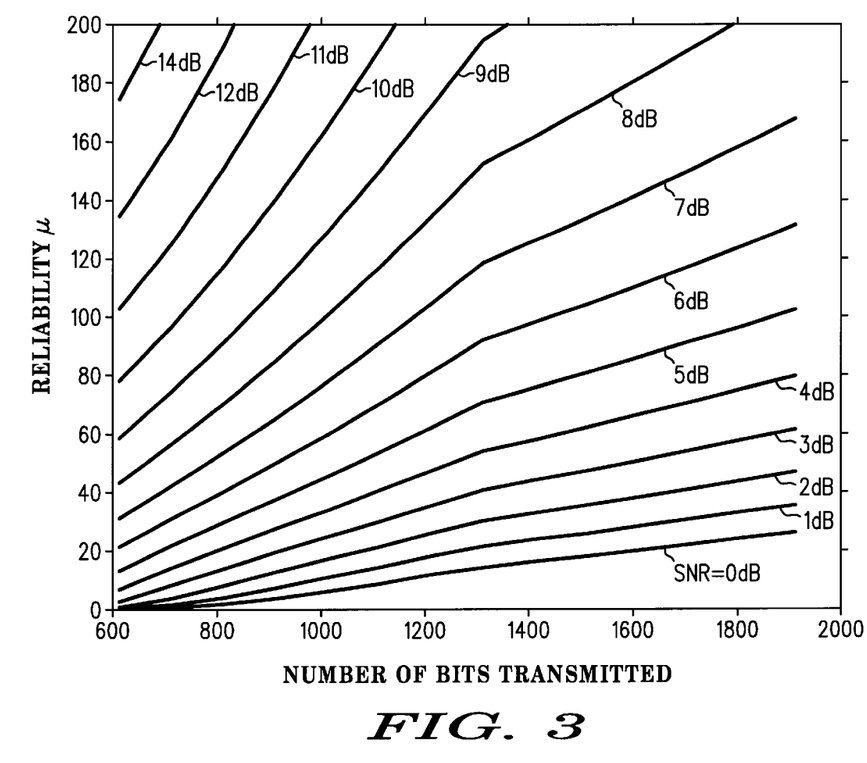
FIG. 3 illustrates codeword reliability as a function of a number of coded bits transmitted and channel condition for a specific convolutional code.

The probability of decoding failure as a function of codeword reliability, $F(\mu)$, is shown in FIG. 2. It is important to note that this relationship holds regardless of the signal-to-noise ratio (SNR) at the input to the decoder. The reliability of a packet increases with the number of bits transmitted. This is specifically shown in FIG. 3. As is evident, the curves in FIG. 3 vary with the SNR at the input to the decoder. The curves shown in FIG. 3 are not specific to the puncturing pattern used in the first transmission, but are dependent on the choice of the mother code.

Size-Optimized HARQ Schemes

Let, g($\alpha$, N, SNR) denote the reliability achieved by combining a packet of reliability $\alpha$ with N additional bits having an average signal-to-noise ratio SNR at the input to the decoder. Consider the function F(.) in FIG. 2. Decoding the first transmission of a packet will generate data bit estimates with reliability $\mu_1$ corresponding to a probability of decoding failure $p_1 = F(\mu_1)$. Transmitting $N_2$ more bits and combining them with the received packet will raise the reliability of the packet to $\mu_2 = g(\mu_1, N_2, \text{SNR})$ corresponding to probability of decoding failure denoted $p_2 = F(\mu_2)$. Additional transmissions will continue to increase the reliability and allow the probability of failure to move down the curve as shown in FIG. 2. Thus, transmitting a block of data of a certain size and requesting feedback from the receiver is equivalent to sampling a point on the curve F(.). FIG. 2 and FIG. 3 then directly relate the retransmission sizes to the probability of decoding error and user delay.

In the preferred embodiment of the present invention, reliability based HARQ schemes are specified in terms of a vector of target reliabilities to be achieved in successive transmissions. Once a target reliability is determined, a number of bits can be requested to hit the target reliability. For example, assume that a maximum of M transmissions can be jointly decoded and a vector of target reliabilities $[\mu^*_1 \mu^*_2 \ldots \mu^*_M]$ is specified. Let a packet be in error after the $i^{th}$ HARQ transmission and have achieved reliability $\mu_i$. Then, the size of the next transmission which comes closest to achieving the target reliability $\mu^*_{i+1}$ is chosen from the set of permissible transmission sizes. More particularly, define an intermediate variable $n_{i+1}$ satisfying $\mu^*_{i+1} = g(\mu_i, n_{i+1}, \overline{SNR})$, where $\overline{SNR}$ is the signal-to-noise ratio at the input to the decoder. Then the size of the next transmission is given by $N_{i+1} = Q(n_{i+1})$, where $Q(\bullet)$ denotes the quantization operation which maps $n_{i+1}$ to the closest permissible transmission size.

In a first embodiment of the present invention target reliabilities are chosen to maximize throughput by performing the following joint optimization:

$$[\mu^*_1 \ \mu^*_2 \ \cdots \ \mu^*_M] = \underset{\tilde{u}_j \atop j=1,\cdots M}{\operatorname{argmax}} \frac{I(1 - F(\tilde{u}_M))}{\left(n_1 + \sum_{j=2}^{M} n_j F(\tilde{u}_{j-1})\right) T_b}, \quad (6)$$

where $$\mu_j = g(\mu_{j-1}, n_j, \overline{SNR}) \text{ and } \mu_0 = 0 \quad (6)$$

The vector $[\mu^*_1 \mu^*_2 \ldots \mu^*_M]$ depends on the signal-to-noise ratio $\overline{SNR}$ and therefore should be computed for a set of quantized $\overline{SNR}$ values in the range of interest. The choice of $\mu^*_1$ in (6) determines the size of the first transmission $N_1$. Hence this methodology can be used as a link adaptation scheme to choose the rate of the initial transmission. Alternatively, a separate link adaptation algorithm that takes into account factors in addition to reliability could be used to determine the size of the first transmission. In this case, the optimization in (6) is performed only for the target reliabilities, $\mu^*_2, \mu^*_3, \ldots, \mu^*_M$.

In an alternate embodiment, a single threshold $\mu^*$ is selected as the target reliability for all transmissions. That is, $\mu^*_1 = \mu^*_2 = \ldots = \mu^*_M = \mu^*$. The reliability threshold $\mu^*$ is based on the desired probability of decoding error $F(\mu^*)$. Given the size of the next transmission, the transmitter (in this example, base station 101) then constructs the transmission by selecting bits from the set of coded bits according to some pre-conceived strategy that generates strong codes or by following the content-specific reliability based strategy described below. In general, it is assumed that the retransmissions may contain bits from the mother codeword that have not been previously transmitted as well as bits that have been included in previous transmissions.

Allowing for complete flexibility in the size of retransmissions might be problematic from a scheduling point of view. Therefore, in the preferred embodiment of the present invention the size of retransmissions is quantized to the natural resolution of the system. In a TDMA system such as EDGE, this size of the retransmission is specified in units of bursts required; in a CDMA system, it is specified in terms of the number of codes assigned; and in an OFDM system, it is specified in terms of the number of carriers allocated.

FIG. 4 is a block diagram of a receiver 400 in accordance with the preferred embodiment of the present invention. As shown, receiver 400 comprises means for decoding 401, which in the preferred embodiment of the present invention is a MAP decoder, however one of ordinary skill in the art will recognize that other decoders may be utilized. The decoder outputs reliability information for individual (coded or information) bits that are input to quality metric generator 403, which outputs a quality metric ($\mu$). The quality metric is output to number generator 405 where a specific number is generated. In particular, a number of additional bits required is determined and output to ACK/NAK generator 407. Although not shown, one of ordinary skill in the art will recognize that receiver 400 additionally comprises those elements (e.g., receiver, memory, storage, logic, . . . , etc.) necessary for HARQ decoding of data.

Figure 5:
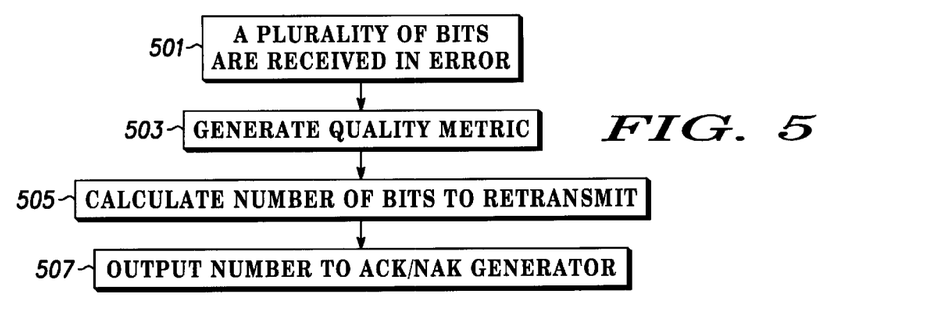
FIG. 5 is a flow chart showing operation of the receiver of FIG. 4 in accordance with the preferred embodiment of the present invention.

FIG. 5 is a flow chart showing operation of receiver 400 of FIG. 4 in accordance with the preferred embodiment of the present invention. The logic flow begins at step 501 where a packet of data is received by MAP decoder 401 in error after the $i^{th}$ HARQ transmission. At step 503 a quality metric ($\mu_i$) is generated from the received data via generator 403. As discussed above, the quality metric for the $i^{th}$ HARQ transmission ($\mu_i$) is based on the average magnitude of the log likelihood ratios of the information bits at the output of the decoder. Once $\mu_i$ is known, it is output to number generator 505 where a number of bits to retransmit is calculated (step 505). In particular, at step 505 a target quality ($\mu^*_{i+1}$) is determined for the $i+1^{th}$ transmission by (or input to) generator 405, and the size of the next transmission, $N_{i+1}$, is then chosen to achieve a target reliability of $\mu^*_{i+1}$. As discussed above, $N_{i+1}$ is a function of the current quality metric ($\mu_i$), the channel condition $\overline{SNR}$, and the target quality $\mu^*_{i+1}$. At step 507 the number $N_{i+1}$ is output to ACK/NAK generator 407 and transmitted with the HARQ ACK/NAK. Base station 101 responds by providing the remote unit with $N_{i+1}$ additional bits on the next transmission.

Because the HARQ ACK/NAK requests a particular amount of data to be transmitted, the above-described HARQ scheme reduces the amount of unnecessary information transmitted during HARQ retransmissions.

Figure 6:
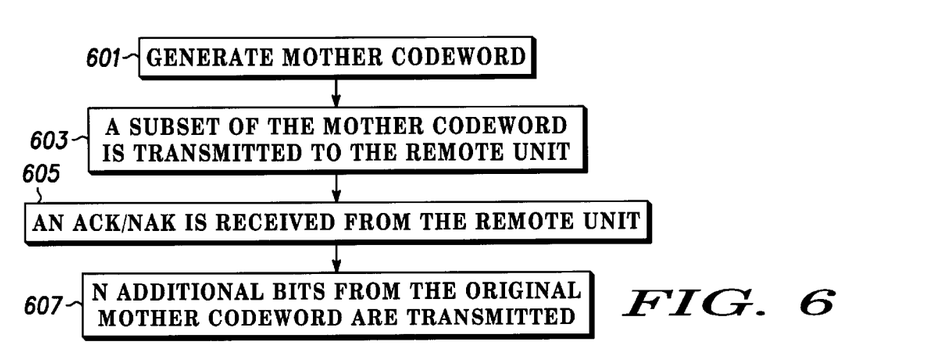
FIG. 6 is a flow chart showing operation of a transmitter in accordance with the preferred embodiment of the present invention.

FIG. 6 is a flow chart showing operation of a transmitter in accordance with the preferred embodiment of the present invention. The logic flow begins at step 601 where a mother codeword is generated. As one of ordinary skill in the art will recognize, a mother codeword comprises a plurality of coded bits that identify a block of data that has been encoded (e.g., convolutionally encoded). At step 603 a subset of the mother codeword is transmitted to the receiver and at step 605 an ACK/NAK is received from the receiver requesting retransmission of a particular subset of the mother codeword. In particular, at step 605 a number of bits (N) to be transmitted is received within the ACK/NAK. Finally, at step 607, the transmitter transmits N additional bits from the original mother codeword.

Figure 7:
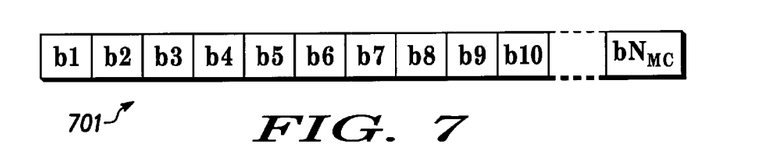
FIG. 7 illustrates transmission of a mother code in accordance with the preferred embodiment of the present invention.

FIG. 7 illustrates mother codeword transmission in accordance with the preferred embodiment of the present invention. As shown, mother codeword 701 comprises a plurality of bits that identify a coded set of data. During the first transmission, a transmitter will transmit only a subset of the mother codeword to the receiver. If the receiver's decoder can successfully decode the original data from what was transmitted, no further information is requested by the receiver. However, if the decoder is unable to decode the original data from what was transmitted, the receiver will request an additional number of bits to be transmitted to it. For example, on the first transmission, bits b1, b4, b7, . . .

are transmitted to the receiver and received by a decoder. At a later time, the transmitter receives an ACK/NAK requesting an additional N bits be retransmitted. The transmitter responds by sending an additional N bits to the receiver. The additional N bits can belong to a predetermined pattern (e.g., b2, b5, b8 . . . ) of appropriate length or can be chosen using a content-specific HARQ strategy as explained below. Regardless of how the N bits are chosen, once they are received by the decoder, they are combined with the originally-received bits, and another decoding attempt takes place. The process repeats if the decoder was again unsuccessful at decoding the data, and the maximum number of transmissions in an attempt has not been exceeded.

Content-specific HARQ Schemes

In the preferred embodiment of the present invention a request was made in the ACK/NAK for retransmission of a predetermined number of bits from the original mother codeword, optimizing the size of retransmitted data. However, in an alternate embodiment of the present invention, HARQ schemes are further improved by choosing the specific bits in the mother codeword that require retransmitting.

Once the size of the next transmission has been selected, the specific bits that require retransmitting can be chosen in one of several ways. In the preferred embodiment, a set of puncturing patterns for each permissible transmission size is predetermined. (A puncturing pattern defines the set of bits chosen from the mother codeword for transmission). Particularly, for a transmission size of N bits, there are $$\binom{N_{MC}}{N}$$

potential puncturing patterns from which the set of puncturing patterns is chosen. The number of puncturing patterns chosen is constrained by the number of feedback bits allocated. Once the size of the next transmission has been selected, the receiver computes the average reliability of all puncturing patterns corresponding to that size and requests the pattern with lowest average reliability from the transmitter. Alternatively, the receiver feeds back positions of the constituent bits in the mother codeword with the lowest reliabilities. The transmitter transmits the bits corresponding to the requested positions in the next transmission while satisfying the transmission size requirement.

Figure 8:
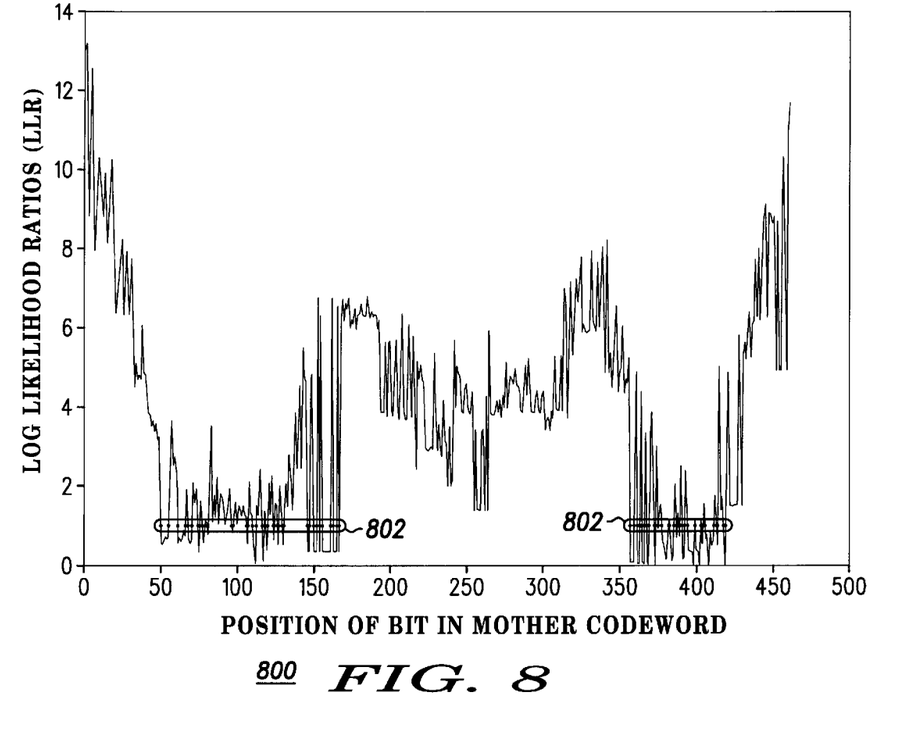
FIG. 8 illustrates a realization of log-likelihood ratios of the individual constituent bits in the mother codeword.

Because errors in a convolutional code usually occur in bursts as depicted in FIG. 8, the receiver can request retransmission of the bits at the beginning of each error burst, and in response the transmitter will retransmit the bits requested and an additional N bits (e.g., 100 bits) following the bit requested. Therefore, in a further alternate embodiment of the present invention, the receiver computes average reliability of every set of W consecutive bits (i.e. window) in the mother codeword. It then feeds back the starting positions of the K non-overlapping windows with lowest reliability, where WK is the size of the next transmission N. The transmitter then transmits these K non-overlapping windows of bits W.

Figure 9:
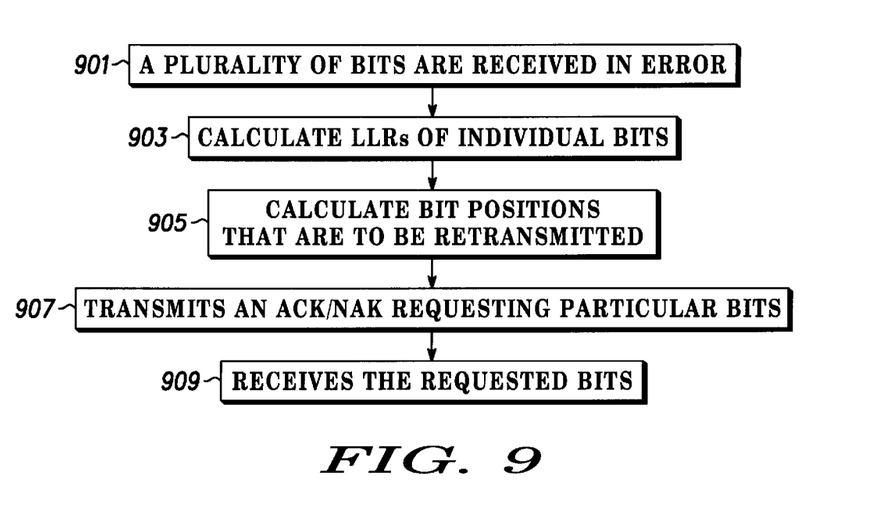
FIG. 9 is a flow chart showing operation of the receiver in accordance with an alternate embodiment of the present invention.

FIG. 9 is a flow chart showing operation of the receiver in accordance with the alternate embodiment of the present invention. The logic flow begins at step 901 where a plurality of bits are received by decoder 401. At step 903, quality metric generator 403 calculates LLRs for all constituent bits in the mother codeword and outputs the LLRs, the bit positions, and (as discussed above) the desired size of the next transmission to pattern selector 409. At step 905, selector 409 outputs the puncturing pattern that is to be retransmitted to the ACK/NAK generator 407. At step 907 ACK/NAK generator 407 transmits an ACK/NAK requesting particular bits within a codeword to be retransmitted, and at step 909, the receiver receives the requested bits.

It should be noted that the receiver is not requesting retransmission of a particular frame or codeword, but actually requesting retransmission of bit/symbols within the frame, or codeword. In particular, prior art ACK/NAK techniques specifically request the retransmission of all that was previously transmitted via an ACK/NAK, and the whole frame/codeword is retransmitted. Unlike prior art ACK/NAK techniques the preferred and alternate embodiments result in particular bits/symbols for a single frame/codeword being requested and transmitted. Thus, only a portion of a single frame/codeword is transmitted to the receiver, and the receiver requests more bits/symbols from the frame/codeword to be transmitted. In the preferred embodiment of the present invention a specific number of bits/symbols are requested, and in the alternate embodiment, specific bits/symbols within the frame are requested.

Figure 10:
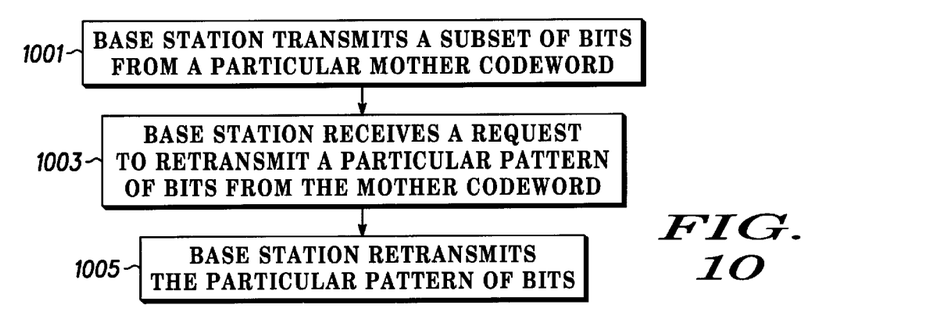
FIG. 10 is a flow chart showing the operation of the transmitter in accordance with the alternate embodiment of the present invention.

FIG. 10 is a flow chart showing operation of the transmitter in accordance with the alternate embodiment of the present invention. The logic flow begins at step 1001 where a transmitter transmits a first plurality of bits from a particular mother codeword. At step 1003 the transmitter receives a request to retransmit a particular pattern of bits from the mother codeword. At step 1005 the transmitter retransmits the particular pattern of bits.

While the invention has been particularly shown and described with reference to a particular embodiment, it will be understood by those skilled in the art that various changes in form and details may be made therein without departing from the spirit and scope of the invention. For example, although in the above description the receiver was calculating retransmission parameters (i.e., size and content) it should be noted that the transmitter may calculate the size and content of any retransmitted packet. In this scenario, the receiver will feedback quality information within the ACK/NAK and the transmitter will calculate the size/content of the retransmitted packet as described above. It is intended that such changes come within the scope of the following claims.

What is claimed is:

1. A method for performing HARQ transmission within a communication system, the method comprising the steps of:

receiving a first plurality of bits;

decoding the first plurality of bits;

determining a current quality metric based on the first plurality of bits;

determining a target quality metric;

determining a number of additional bits needed to achieve the target quality metric, wherein the step of determining the number of additional bits needed to achieve the target quality metric comprises the step of determining N, wherein N is a function of the current quality metric ($\mu$), where $$\mu = \frac{1}{l}\sum_{k=1}^{l}|LLR(k)|$$

and LLR(k) is the log likelihood ratio for the $k^{th}$ bit;

requesting the number of additional bits needed to achieve the target quality metric;

receiving the number of additional bits;
combining the number of additional bits with the first plurality of bits; and
attempting to decode a data packet based on the number of additional bits and the first plurality of bits.

2. The method of claim 1 wherein the step of determining the number of additional bits needed to achieve the target quality metric comprises the step of determining N, wherein N is a function of the current quality metric, a channel condition $\overline{SNR}$, and the target quality metric.

3. The method of claim 1 wherein the step of requesting the number of additional bits needed to achieve the target quality metric comprises the step of determining individual bits that should be retransmitted and requesting the individual bits.

4. The method of claim 3 wherein the step of determining individual bits that should be retransmitted comprises the step of determining a log likelihood for each bit in a mother codeword and determining those bits with a low log likelihood ratio.

5. A method comprising the steps of:
receiving a plurality of bits in error after the ith transmission;
decoding the plurality of bits;
determining a quality metric ($\mu_i$) based on the plurality of bits;
determining a target quality metric ($\mu^*_{i+1}$);
determining a number ($N_{i+1}$) of additional bits needed to achieve the target quality metric, wherein the step of determining the number of additional bits ($N_{i+1}$) needed to achieve the target quality metric ($\mu^*_{i+1}$) comprises the step of determining $N_{i+1}$, where $N_{i+1}$ is a function of the current quality metric ($\mu_i$), a channel condition $\overline{SNR}$, and the target quality metric ($\mu^*_{i+1}$);
requesting the number of additional bits needed to achieve the target quality metric;
receiving the number of additional bits;
combining the number of additional bits with the plurality of bits; and
attempting to decode a data packet based on the number of additional bits and the plurality of bits.

6. The method of claim 5 wherein the step of determining the quality metric ($\mu_i$) comprises the step of determining the current quality metric, $$\mu_i = \frac{1}{I}\sum_{k=1}^{I} |LLR(k)|$$

where LLR(k) is the log likelihood ratio for the $k^{th}$ bit.

7. A method for performing HARQ transmission within a communication system, the method comprising the steps of:
receiving a first plurality of bits from a mother codeword;
decoding the plurality of bits;
determining a quality metric for each bit within the mother codeword;
determining individual bits that should be retransmitted, wherein the step of determining individual bits that should be retransmitted comprises the step of determining a predetermined puncturing pattern with lowest reliability from a set of puncturing patterns;
requesting the individual bits;
receiving second plurality of bits from the data packet in response to the request;
combining the first and the second plurality of bits; and
attempting to decode the data packet based on first and the second plurality of bits.

8. The method of claim 7 wherein the step of determining a quality metric for each bit within the mother codeword comprises the step of determining a log likelihood ratio for each bit.

9. The method of claim 8 wherein the step determining individual bits that should be retransmitted comprises the step of determining individual bits with a low log likelihood ratio.

10. The method of claim 9 wherein the step of requesting individual bits comprises the step of requesting the individual bits with the low log likelihood ratio.

11. The method of claim 8 wherein the step of determining individual bits that should be retransmitted comprises the step of computing an average reliability of every set of W consecutive bits in the mother codeword, and the step of requesting the individual bits comprises the step of requesting starting positions of non-overlapping windows with lowest reliability.

12. An apparatus comprising:
a decoder outputting reliabilities;
a quality metric generator outputting a quality metric;
a number generator, receiving the current quality metric, a target quality metric, and a channel condition and determining a number of additional bits needed to achieve the target quality metric, wherein the number of additional bits needed to achieve the target quality metric is a function of the current quality metric ($\mu$), where $$\mu = \frac{1}{I}\sum_{k=1}^{I} |LLR(k)|$$

and LLR(k) is the log likelihood ratio for the $k^{th}$ bit.

13. An apparatus comprising:
means (401) for decoding a received plurality of bits after the ith transmission;
means (403) for determining a quality metric ($\mu_i$) based on the plurality of bits;
means (403) for determining a target quality metric ($\mu^*_{i+1}$);
means (405) for determining a number ($N_{i+1}$) of additional bits needed to achieve the target quality metric, wherein the number of additional bits ($N_{i+1}$) needed to achieve the target quality metric ($\mu^*_{i+1}$) comprises determining $N_{i+1}$, where $N_{i+1}$ is a function of the current quality metric ($\mu_i$), a channel condition $\overline{SNR}$, and the target quality metric ($\mu^*_{i+1}$);
means (407) for requesting the number of additional bits needed to achieve the target quality metric;
means (401) for receiving the number of additional bits;
means (401) for combining the number of additional bits with the plurality of bits; and
means (401) for attempting to decode a data packet based on the number of additional bits and the plurality of bits.

* * * * *